(12) United States Patent
Lin et al.

(10) Patent No.: US 9,204,074 B2
(45) Date of Patent: Dec. 1, 2015

(54) MULTI-MODE OPERATION PIXEL DESIGN FOR PIXEL PERFORMANCE IMPROVEMENT

(71) Applicant: Himax Imaging Limited, Tainan (TW)

(72) Inventors: Dong-Long Lin, Tainan (TW); Chung-Ren Li, Tainan (TW)

(73) Assignee: HIMAX IMAGING LIMITED, Tainan (TW)

( * ) Notice: Subject to any disclaimer, the term of this patent is extended or adjusted under 35 U.S.C. 154(b) by 0 days.

(21) Appl. No.: 14/229,075

(22) Filed: Mar. 28, 2014

(65) Prior Publication Data

US 2015/0281611 A1     Oct. 1, 2015

(51) Int. Cl.
*H01L 27/14* (2006.01)
*H04N 5/378* (2011.01)
*H01L 27/146* (2006.01)
*H04N 5/374* (2011.01)

(52) U.S. Cl.
CPC .......... *H04N 5/378* (2013.01); *H01L 27/14609* (2013.01); *H01L 27/14612* (2013.01); *H01L 27/14643* (2013.01); *H04N 5/374* (2013.01)

(58) Field of Classification Search
CPC ............. H01L 27/14603; H01L 27/14609; H01L 27/14643; H01L 27/14689; H01L 27/14; H04N 5/378
USPC ........... 257/291, 292, 431, 432, 443
See application file for complete search history.

(56) References Cited

U.S. PATENT DOCUMENTS

2007/0023798 A1*  2/2007  McKee ............. 257/291
2012/0086095 A1*  4/2012  Nishiyama et al. ........... 257/432

* cited by examiner

*Primary Examiner* — Chuong A Luu
*Assistant Examiner* — Rodolfo Fortich
(74) *Attorney, Agent, or Firm* — McClure, Qualey & Rodack, LLP (57) ABSTRACT

A pixel circuit includes a plurality of pixel units, and one of the pixel units includes a photosensor, a readout circuit, and a switch circuit. The readout circuit is coupled to a supply voltage and the photosensor, which includes a floating diffusion node for storing data of the photosensor and an output node for outputting data of the floating diffusion node. The switch circuit is coupled between the photosensor and a tail node, wherein the tail node is coupled to the floating diffusion node of another pixel unit.

5 Claims, 8 Drawing Sheets

MULTI-MODE OPERATION PIXEL DESIGN FOR PIXEL PERFORMANCE IMPROVEMENT

BACKGROUND OF THE INVENTION

1. Field of the Invention

The disclosure relates generally to a pixel circuit, and more particularly to a multi-mode pixel circuit for pixel performance improvement.

2. Description of the Related Art

A CMOS imager circuit includes a focal plane array of pixel cells, each one of the cells including a photosensor, for example, a photogate, photoconductor or a photodiode overlying a substrate for accumulating a photo-generated charge in the underlying portion of the substrate. Each pixel cell has a readout circuit that includes at least an output field effect transistor formed in the substrate and a charge-storage region formed on the substrate connected to the gate of an output transistor. The charge-storage region may be constructed as a floating diffusion node. Each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the necessary functions of: (1) photon-to-charge conversion; (2) accumulation of image charge; (3) resetting the storage region to a known state before the transfer of charge to it; (4) transfer of charge to the storage region; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

BRIEF SUMMARY OF THE INVENTION

The invention provides a pixel circuit including a plurality of pixel units. One of the pixel units includes a photosensor, a readout circuit, coupled to a supply voltage and the photosensor and comprising a floating diffusion node for storing data of the photosensor and an output node for outputting data of the floating diffusion node, and a switch circuit, coupled between the photosensor and a tail node, wherein the tail node is coupled to the floating diffusion node of another pixel unit.

In an embodiment of the pixel circuit, the readout circuit includes a first switch, controlled by a reset signal and coupled between the supply voltage and the floating diffusion node; a MOS transistor, controlled by a voltage level of the floating diffusion node and coupled to the supply voltage; a second switch, controlled by a select signal and coupled between a source node of the MOS transistor and an output node; and a third switch, controlled by a read signal and coupled between the floating diffusion node and the photosensor.

In an embodiment of the pixel circuit, the switch circuit comprises: a fourth switch, controlled by a first control signal and coupled between the photosensor and a first node, wherein a virtual capacitor is formed in the first node; and a fifth switch, controlled by a second control signal and coupled between the first node and the tail node.

In an embodiment of the pixel circuit, a conversion gain through the third switch to the output node is higher than that through the fourth switch and the fifth switch to the output node of the other pixel unit.

In an embodiment of the pixel circuit, the fourth switch is controlled by a threshold voltage and a plurality of blooming electrons of the photosensor flow into the virtual capacitor when the pixel circuit operates in a blooming control mode.

In an embodiment of the pixel circuit, data of the photosensor is read at the output node through the third switch, the MOS transistor, and the second switch, while data of the virtual capacitor is read at the output node of another pixel circuit through the fifth switch and the MOS transistor and the second switch of the other pixel circuit, and data of the photosensor and data of the virtual capacitor are then summed up afterward.

In an embodiment of the pixel circuit, the fourth switch, the fifth switch, and the first switch of the other pixel circuit are simultaneously turned on during an integration period of the photosensor wherein when the pixel circuit operates in a logarithmic mode.

In an embodiment of the pixel circuit, data of the photosensor is transferred to the virtual capacitor through the fourth switch after an integration period of the photosensor, the first switch and the third switch are then turned on to reset the photosensor, and data of the virtual capacitor is read at the output node of the other pixel circuit through the fifth switch and the MOS transistor and the second switch of the other pixel circuit during the resetting of the photosensor when the pixel circuit operates in a global shutter mode.

In an embodiment of the pixel circuit, the first switch of the other pixel circuit and the fifth switch are turned on to reset the virtual capacitor after reading data of the virtual capacitor.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
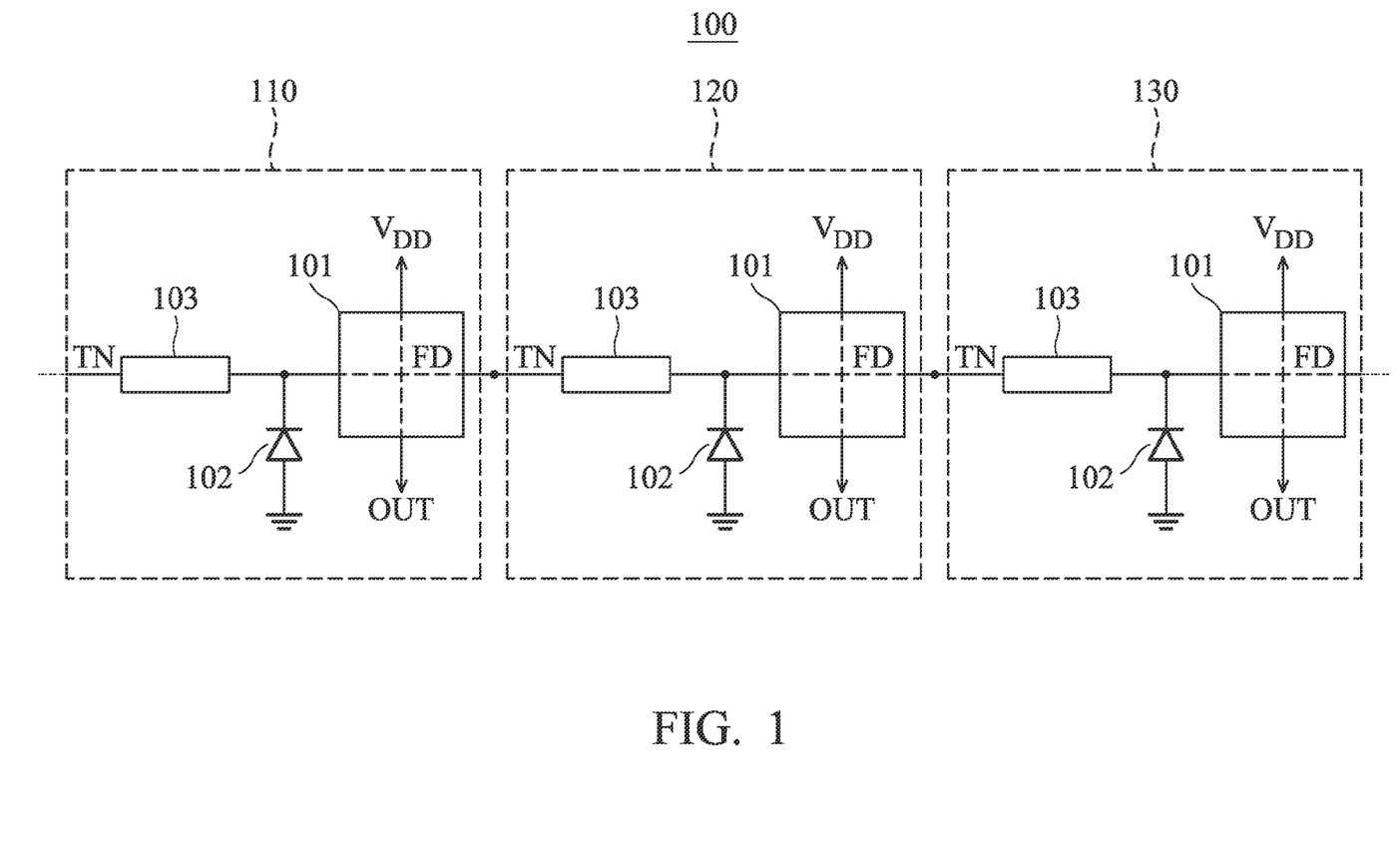
FIG. 1 is a block diagram of the pixel circuit 100 in accordance with an embodiment of the invention.

FIG. 1 is a block diagram of the pixel circuit 100 in accordance with an embodiment of the invention. As shown in FIG. 1, the pixel circuit 100 includes a plurality of pixel units, while the first pixel unit 110, the second pixel unit 120, and the third pixel unit 130 are illustrated herein. One of the first pixel unit 110, the second pixel unit 120, and the third pixel unit 130 includes the readout circuit 101, the photosensor 102, and the switch circuit 103. The supply voltage $V_{DD}$ is applied to the readout circuit 101 which collects the electrons transferred from the photosensor 102 at the floating diffusion node FD and transmits an output signal at the output node OUT. The switch circuit 103 is coupled between the photosensor 102 and the tail node TN. According to an embodiment of the invention, the tail node TN is coupled to the floating diffusion node FD of another pixel unit.

According to the embodiment of FIG. 1, the switch circuit 103 of the third pixel unit 130 is coupled to the floating diffusion node FD of the second pixel unit 120, and the switch circuit 103 of the second pixel unit 120 is coupled to the floating diffusion node FD of the first pixel unit 110. In other words, the pixel units of the embodiment of FIG. 1 are cascaded.

Figure 2:
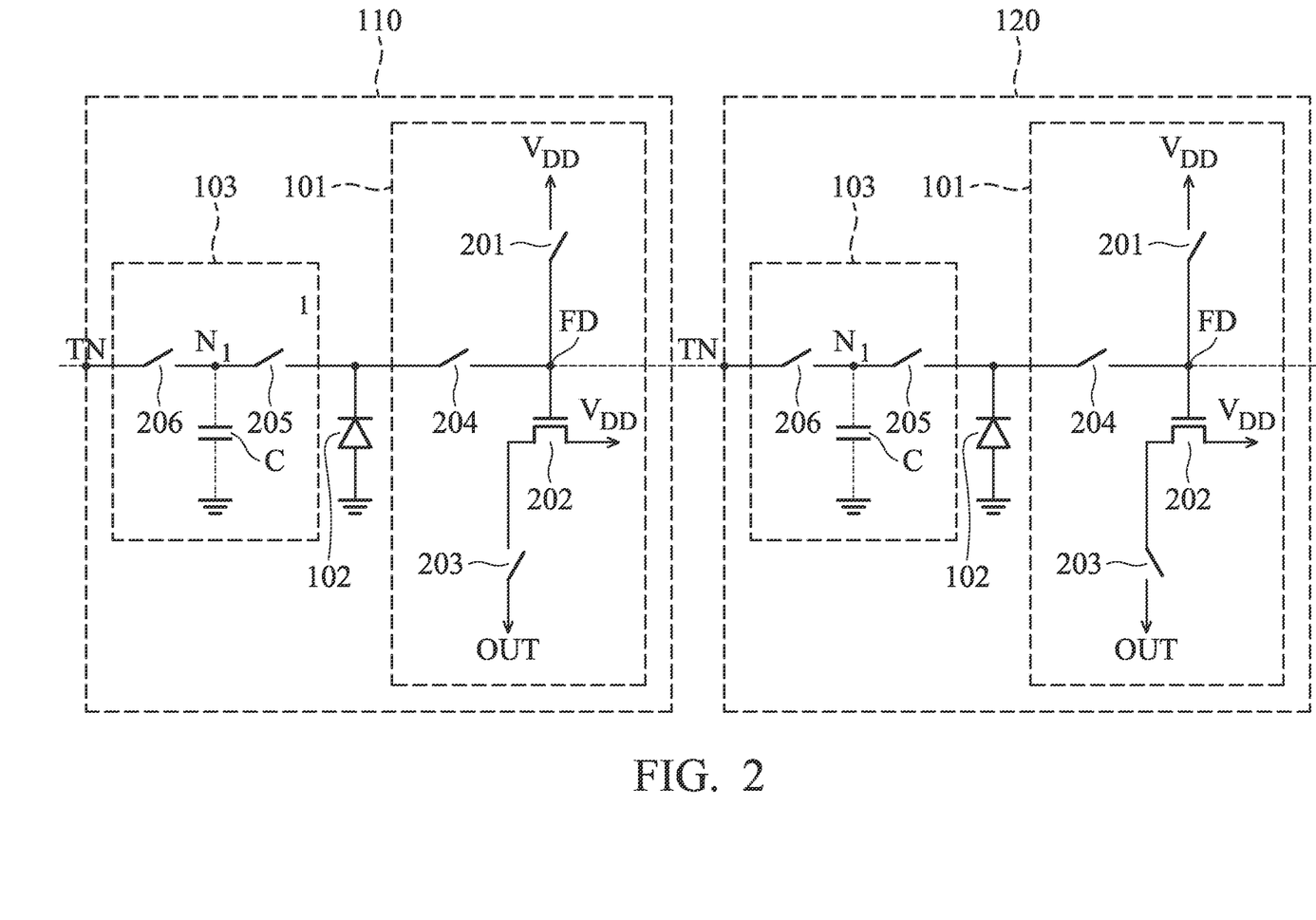
FIG. 2 is a schematic of the pixel circuit 200 in accordance with an embodiment of the invention.

FIG. 2 is a schematic of the pixel circuit 100 in accordance with an embodiment of the invention. As shown in FIG. 2, the readout circuit 101 includes the first switch 201, the MOS transistor 202, the second switch 203, and the third switch 204. The first switch 201 is controlled by a reset signal RST and coupled between the supply voltage $V_{DD}$ and the floating diffusion node FD. The MOS transistor 202 is controlled by a voltage level of the floating diffusion node FD and the drain node of the MOS transistor 202 is coupled to the supply voltage $V_{DD}$. The second switch 203 is controlled by the select signal SEL and coupled between the source node of the MOS transistor 202 and the output node OUT. The third switch 204 is controlled by the read signal READ and coupled between the floating diffusion node FD and the photosensor 102.

The switch circuit 103 includes the fourth switch 205 and the fifth switch 206. The fourth switch 205 is controlled by the first control signal COM and coupled between the photosensor 102 and the first node $N_1$. The fifth switch 206 is controlled by the second control signal $CON_2$ and coupled between the first node $N_1$ and the tail node TN. A virtual capacitor C is formed between the first node $N_1$ and ground. According to an embodiment of the invention, the virtual capacitor C is a parasitic capacitor. In addition, the tail node TN is coupled to the floating diffusion node FD of another pixel unit. The switches in FIG. 2 can be implemented by MOS transistor.

The pixel circuit 100 of FIG. 1 can be operated in a dual conversion gain mode, a blooming control mode, a linear-logarithm mode, or a global shutter mode which will be described in detail in the following description. The switches in FIG. 2 are implemented by NMOS transistors but not intended to be limited to the embodiment.

Figure 3:
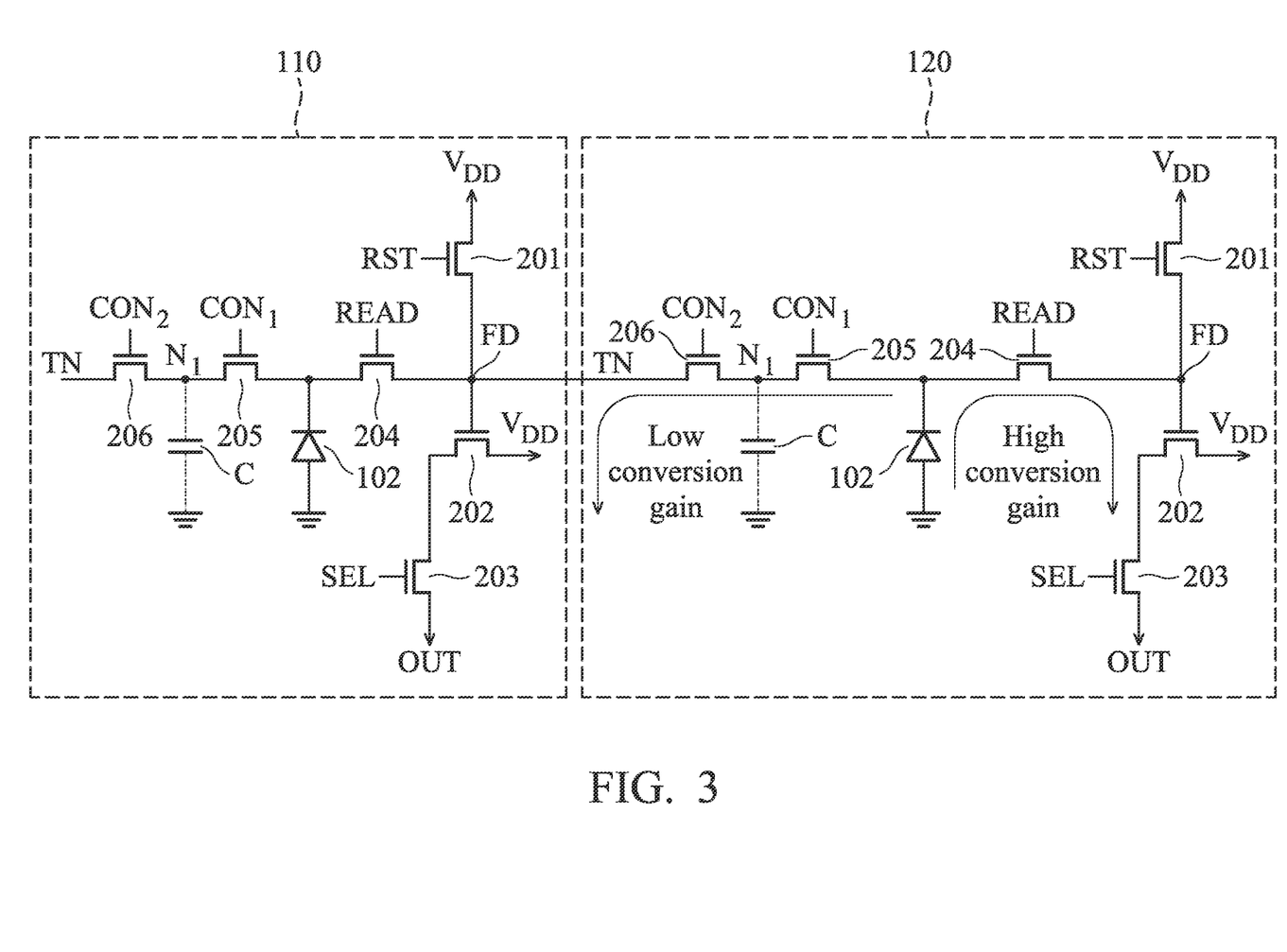
FIG. 3 is a schematic illustration of the first pixel unit 110 and the second pixel unit 120 operated in the dual conversion gain mode in accordance with an embodiment of the invention.

For the purpose of illustrating the behavior of the pixel circuit 100, the behavior of the second pixel unit 120 are taken for instance hereafter. FIG. 3 is a schematic illustration of the first pixel unit 110 and the second pixel unit 120 operated in the dual conversion gain mode in accordance with an embodiment of the invention.

Dual Conversion Gain Mode

The electrons accumulated by the photosensor 102 of the second pixel unit 120 during an integration period can be converted to a voltage level, and the voltage level can be read out at either the output node OUT of the second pixel unit 120 or the output node OUT of the first pixel unit 110, in which either way results in different conversion gain. Regarding the voltage level corresponding to the photosensor 102 of the second pixel unit 120 is read out at the output node OUT of the second pixel unit 120, the electrons accumulated by the photosensor 102 are transferred to the floating diffusion node FD of the second pixel unit 120 through the third switch 204, in which the voltage level of the floating diffusion node FD is initially reset to the supply voltage $V_{DD}$.

Corresponding to the transference of the electrons, the decrement of the voltage level on the floating diffusion node FD is inversely proportional to the parasitic capacitance of the floating diffusion node FD, and the parasitic capacitance of the floating diffusion node FD is able to keep low which leads to a high conversion gain. In addition, the MOS transistor 202 is a source follower. When the second switch 203 activated by the select signal SEL, the voltage level of the output node OUT is equal to the threshold voltage of the MOS transistor 202 subtracted from the voltage level of the floating diffusion node FD.

As to reading out the information of the photosensor 102 of the second pixel unit 120 at the output node OUT of the first pixel unit 110, the electrons accumulated by the photosensor 102 of the second pixel unit 120 are transferred to the floating diffusion node FD through the switch circuit 103 (the fourth switch 205 and the fifth switch 206), and then converted to a voltage level outputted at the output node OUT of the first pixel unit 110. However, due to the fifth switch 206 coupling the floating diffusion node FD of the first pixel unit 110 and the first node N1 of the second pixel unit 120 together, the gate capacitance of the MOS transistor 202 of the first pixel unit 110 should equal the parasitic capacitance of the floating diffusion node FD adding the virtual capacitor C of the second pixel unit 120, which results in the conversion gain of reading out at the output node OUT of the first pixel unit 110 lower than that of reading out at the output node OUT of the second pixel unit 120 (the conversion gain is inversely proportional to the capacitance). In this case, two paths with different conversion gains are generated.

According to an embodiment of the invention, the conversion gain through the third switch 204 to the output node OUT is 190 uV/e, and the conversion gain through the fourth switch 205 and the fifth switch 206 to the output node OUT the other pixel unit is 60 uV/e.

Blooming Control Mode

Figure 7A:
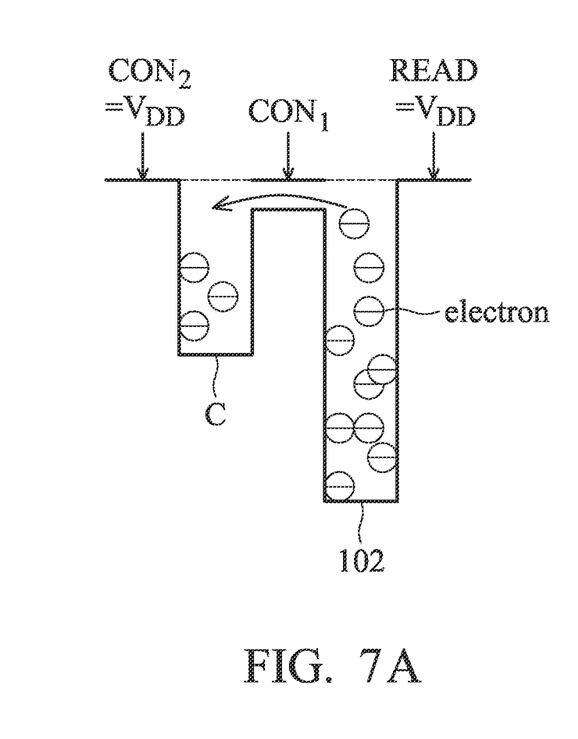
FIGS. 7A and 7B show the behavior of the photosensor and the virtual capacitor.
Figure 7B:
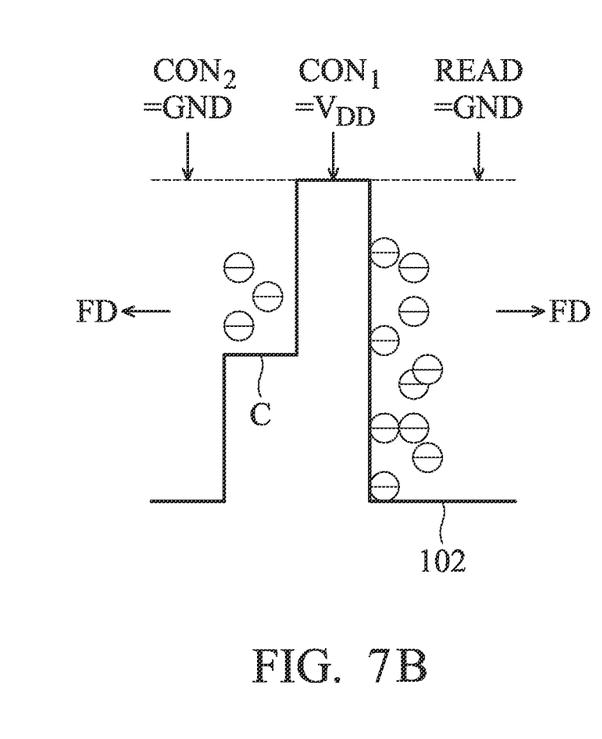

FIGS. 7A and 7B show the behavior of the photosensor and the virtual capacitor. Referring to FIG. 3, when the second pixel unit 120 operating in the blooming control mode, the first control signal CON1 is a predetermined voltage biasing the fourth switch 205 (lower the energy barrier between the photosensor 102 and the virtual capacitor C, FIG. 7A), and both the third switch 204 and the fifth switch 206 are turned OFF. While the photosensor 102 is converting photons to electrons in integration periods and the electrons are exceeding a predetermined level, the excess electrons flow through the fourth switch 205 and are stored in the virtual capacitor C of the first node N1. The electrons of the photosensor 102 and the electrons stored in the virtual capacitor C can be read out at the output node OUT of the second pixel unit 120 and the output node OUT of the first pixel unit 110 respectively. In this embodiment, NMOS transistor is implemented as each switch in FIG. 3, so the predetermined voltage is lower than the supply voltage VDD. In this way, the fourth switch 205 provides a path for electrons between the photosensor 102 and the virtual capacitor C. The electrons flow into the virtual capacitor C from the photosensor 102, when the electrons are exceeding the predetermined level (FIG. 7A). The more the predetermined voltage is close to the supply voltage VDD, the higher the predetermined level is. It is noted that the predetermined voltage may be set to the supply voltage VDD for forming isolation between the electrons of the photosensor 102 and the electrons stored in the virtual capacitor C (FIG.

7B), when the electrons of the photosensor 102 and the electrons stored in the virtual capacitor C are read.

During an integration period, the photosensor 102 is converting photons to electrons and the first switch 201 is turned ON to reset the floating diffusion node FD to the supply voltage $V_{DD}$. If the fourth switch 205 was not biased with a predetermined voltage, the excess electrons would flow into the floating diffusion node FD while the floating diffusion node FD is resetting. That is, part of the information that sensed by the photosensor 102 is erased.

Therefore, with the aid of the fourth switch 205 and the virtual capacitor C, the excess electrons can be conserved and read out at the output node OUT of another pixel unit. The information of the photosensor 102 and the virtual capacitor C will be summed up by a DIP system afterward.

Linear-Logarithmic Mode

Figure 4:
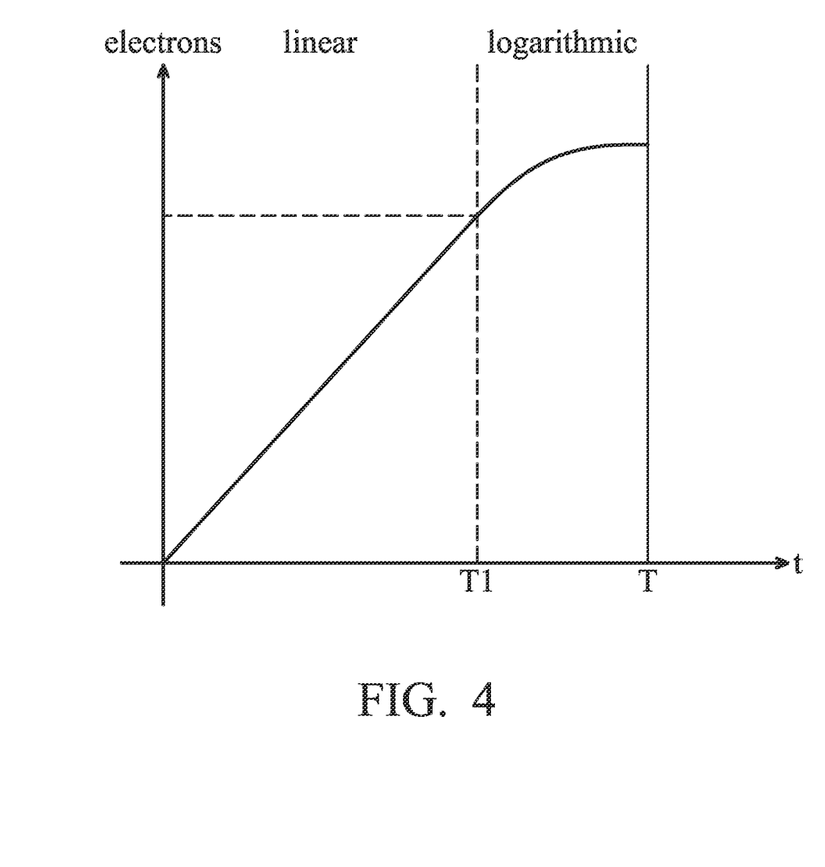
FIG. 4 shows the electrons accumulated by the photosensor operated in the linear-logarithmic mode in an integration period T in accordance with an embodiment of the invention.

Logarithmic response is used to extend the dynamic range in high illumination environment, but it is poor in low light condition. FIG. 4 shows the electrons accumulated by the photosensor operated in the linear-logarithmic mode in an integration period T in accordance with an embodiment of the invention. When the DIP system senses that the environment is high illumination, the logarithmic mode will be activated after a predetermined time T1.

Before the predetermined time T1, the third switch 204 and the fourth switch 205 are both OFF, and the photosensor 102 is accumulating the electrons. After the predetermined time T1, for the purpose of preventing the electrons from flowing to the floating diffusion node FD, the fourth switch 205, the fifth switch 206, and the first switch of the first pixel unit 110 in FIG. 3 are turned on, and the accumulated electrons are thus increased with the logarithmic curve.

Global Shutter Mode

By using the virtual capacitor C of the first node $N_1$ and disable the high conversion gain path, the global shutter can be implemented. FIGS. 5A-5D illustrate the operations of the global shutter mode in accordance with an embodiment of the invention. In FIGS. 5A-5D, the second pixel unit 120 and part of the first pixel unit 110 of FIG. 3 are used to illustrate the behavior of the global shutter mode, and only the relevant switches are shown in switch symbols for simplifying the illustration. FIG. 6 shows the operation sequence of the global shutter mode in accordance with an embodiment of the invention.

Figure 5A:
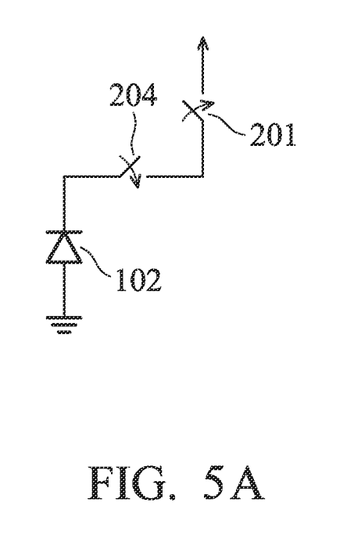
FIGS. 5A-5D illustrate the operations of the global shutter mode in accordance with an embodiment of the invention.
Figure 5B:
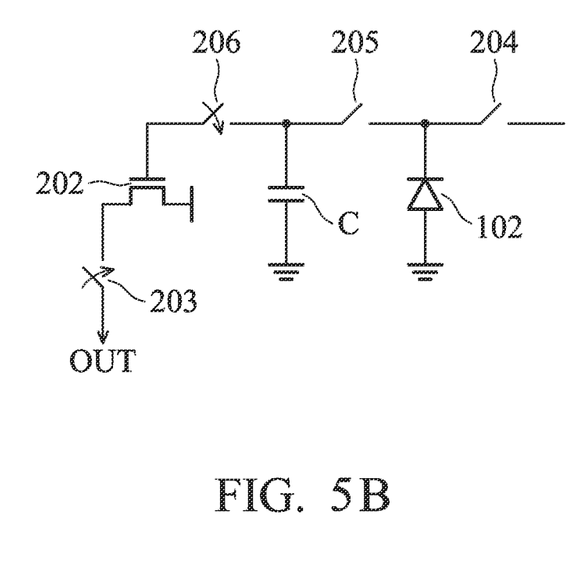
Figure 5C:
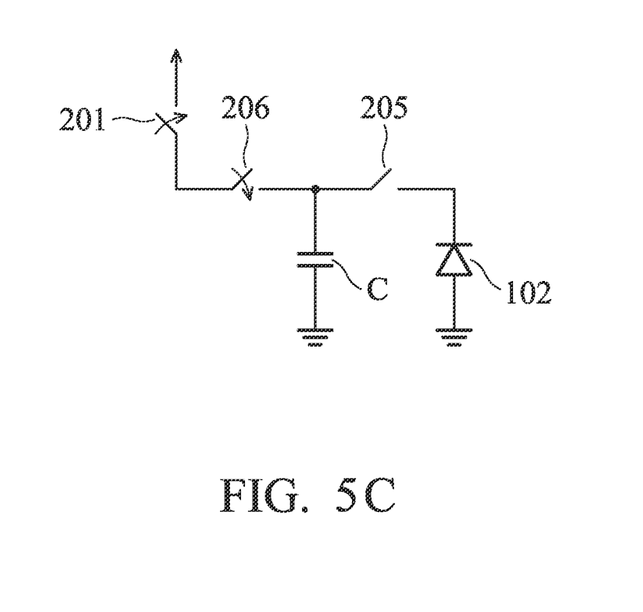
Figure 6:
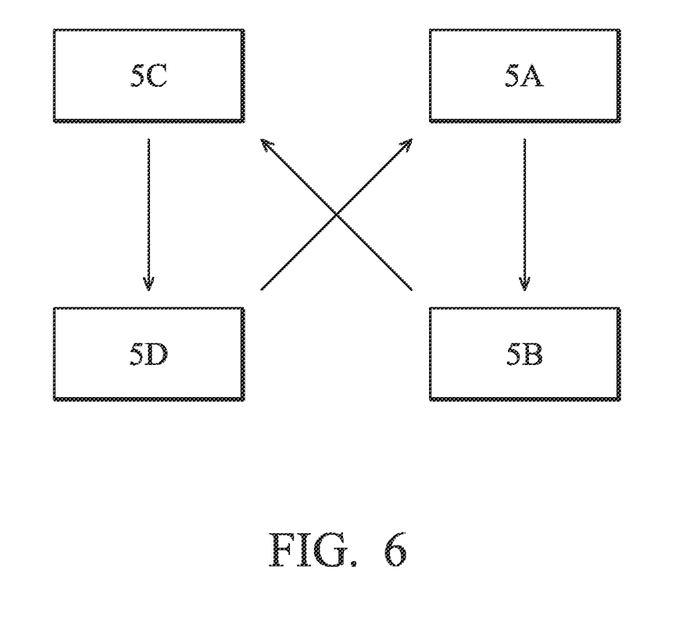
FIG. 6 shows the operation sequence of the global shutter mode in accordance with an embodiment of the invention.

The first switch 201 and the third switch 204 are turned on to reset the photosensor 102, which is shown in FIG. 5A. FIG. 5B shows the pixel unit operates in the integration period. The third switch 204 and the fourth switch 205 are turned OFF for the photosensor 102 accumulating the electrons, and the fifth switch 206 and the second switch of another pixel unit are turned ON to output the information stored in the virtual capacitor C which belongs to the previous integration period. In FIG. 5C, the fifth switch 206 and the first switch 201 of another pixel unit are turned on to reset the virtual capacitor C.

Figure 5D:
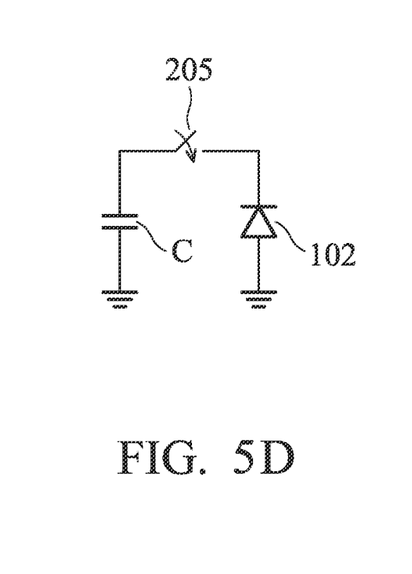

Then, FIG. 5D shows the fourth switch 205 is turned ON to transfer the electrons from the photosensor 102 to the virtual capacitor C. After transference of the electrons to the virtual capacitor, it goes to FIG. 5A for resetting the photosensor 102 and then goes to FIG. 5B for outputting the information stored in the virtual capacitor C at the output node OUT of another pixel unit. Finally, the operation sequence is shown in FIG. 6.

While the integration time is up, the electric shutter TxL turns on to transfer the electrons from PD to FD. Then the signal can be read out sequentially through the output node located in left bottom side of each photodiode.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A pixel circuit, comprising:
    a plurality of pixel units, each one of the pixel units comprising:
    an individual photosensor;
    an individual readout circuit, coupled to a supply voltage and the photosensor and comprising a floating diffusion node for storing data of the photosensor and an output node for outputting data of the floating diffusion node, wherein the readout circuit comprises:
        a first switch, controlled by a reset signal and coupled between the supply voltage and the floating diffusion node;
        a MOS transistor, controlled by a voltage level of the floating diffusion node and a drain node coupled to the supply voltage;
        a second switch, controlled by a select signal and coupled between a source node of the MOS transistor and an output node; and
        a third switch, controlled by a read signal and coupled between the floating diffusion node and the photosensor; and
    an individual switch circuit, coupled between the photosensor and a tail node, wherein the tail node is coupled to the floating diffusion node of another pixel unit, wherein the switch circuit comprises:
        a fourth switch, controlled by a first control signal and coupled between the photosensor and a first node, wherein a virtual capacitor is formed in the first node; and
        a fifth switch, controlled by a second control signal and coupled between the first node and the tail node, wherein a conversion gain through the third switch to the output node is higher than that through the fourth switch and the fifth switch to the output node of the other pixel unit.

2. A pixel circuit, comprising:
    a plurality of pixel units, each one of the pixel units comprising:
    an individual photosensor;
    an individual readout circuit, coupled to a supply voltage and the photosensor and comprising a floating diffusion node for storing data of the photosensor and an output node for outputting data of the floating diffusion node, wherein the readout circuit comprises:
        a first switch, controlled by a reset signal and coupled between the supply voltage and the floating diffusion node;
        a MOS transistor, controlled by a voltage level of the floating diffusion node and a drain node coupled to the supply voltage;
        a second switch, controlled by a select signal and coupled between a source node of the MOS transistor and an output node; and
        a third switch, controlled by a read signal and coupled between the floating diffusion node and the photosensor; and
    an individual switch circuit, coupled between the photosensor and a tail node, wherein the tail node is coupled to the floating diffusion node of another pixel unit, wherein the switch circuit comprises:

a fourth switch, controlled by a first control signal and coupled between the photosensor and a first node, wherein a virtual capacitor is formed in the first node; and a fifth switch, controlled by a second control signal and coupled between the first node and the tail node, wherein the third switch is OFF, the fourth switch is controlled by a threshold voltage, the fifth switch is OFF, and a plurality of blooming electrons of the photosensor flow into the virtual capacitor when the pixel circuit operates in a blooming control mode, wherein data of the photosensor is read at the output node through the third switch, the MOS transistor, and the second switch, while data of the virtual capacitor is read at the output node of another pixel circuit through the fifth switch and the MOS transistor and the second switch of the other pixel circuit, and data of the photosensor and data of the virtual capacitor are then summed up afterward.

3. A pixel circuit, comprising:

a plurality of pixel units, each one of the pixel units comprising:

an individual photosensor;

an individual readout circuit, coupled to a supply voltage and the photosensor and comprising a floating diffusion node for storing data of the photosensor and an output node for outputting data of the floating diffusion node, wherein the readout circuit comprises:

a first switch, controlled by a reset signal and coupled between the supply voltage and the floating diffusion node;

a MOS transistor, controlled by a voltage level of the floating diffusion node and a drain node coupled to the supply voltage;

a second switch, controlled by a select signal and coupled between a source node of the MOS transistor and an output node; and a third switch, controlled by a read signal and coupled between the floating diffusion node and the photosensor; and an individual switch circuit, coupled between the photosensor and a tail node, wherein the tail node is coupled to the floating diffusion node of another pixel unit, wherein the switch circuit comprises:

a fourth switch, controlled by a first control signal and coupled between the photosensor and a first node, wherein a virtual capacitor is formed in the first node; and a fifth switch, controlled by a second control signal and coupled between the first node and the tail node, wherein when the pixel circuit operates in a logarithmic mode, the fourth switch, the fifth switch, and the first switch of the other pixel circuit are simultaneously turned on during an integration period of the photosensor.

4. The pixel circuit of claim 1, wherein at first, data of the photosensor is transferred to the virtual capacitor through the fourth switch after an integration period of the photosensor, then the fourth switch is turned off, and the first switch and the second switch are turned on to reset the photosensor, and at third, data of the virtual capacitor is read at the output node of the other pixel circuit through the fifth switch and the MOS transistor and the second switch of the other pixel circuit during the resetting of the photosensor when the pixel circuit operates in a global shutter mode.

5. The pixel circuit of claim 4, wherein the first switch of the other pixel circuit and the fifth switch are turned on to reset the virtual capacitor after reading data of the virtual capacitor.

* * * * *